(12) United States Patent
Kim et al.

(10) Patent No.: US 7,274,257 B2
(45) Date of Patent: Sep. 25, 2007

(54) VARIABLE GAIN WIDEBAND AMPLIFIER

(75) Inventors: Moon Sun Kim, Kyungki-do (KR);
Won Jin Baek, Kyungki-do (KR)

(73) Assignee: Samsung Electro-Mechanics Co., Ltd. (KR)

( * ) Notice: Subject to any disclaimer, the term of this patent is extended or adjusted under 35 U.S.C. 154(b) by 123 days.

(21) Appl. No.: 11/292,208

(22) Filed: Dec. 2, 2005

(65) Prior Publication Data

US 2006/0197599 A1    Sep. 7, 2006

(30) Foreign Application Priority Data

Mar. 2, 2005 (KR) .................. 10-2005-0017434

(51) Int. Cl.
*H03G 3/00* (2006.01)
(52) U.S. Cl. .............. 330/278; 330/294; 330/149
(58) Field of Classification Search .......... 330/278, 330/294, 149
See application file for complete search history.

(56) References Cited

U.S. PATENT DOCUMENTS

| | | | |
|---|---|---|---|
| 4,612,514 A * | 9/1986 | Shigaki et al. | 330/277 |
| 5,304,946 A * | 4/1994 | Sano et al. | 330/254 |
| 6,285,257 B1 | 9/2001 | Abe et al. | |
| 6,400,227 B1 * | 6/2002 | Goldfarb et al. | 330/295 |
| 6,404,283 B1 * | 6/2002 | Lau et al. | 330/129 |
| 2007/0030076 A1 * | 2/2007 | Kim et al. | 330/311 |

FOREIGN PATENT DOCUMENTS

| | | |
|---|---|---|
| EP | 0 337 561 A1 | 4/1989 |
| KR | 10200300879067 A | 11/2003 |
| KR | 1020040047171 A | 6/2004 |
| WO | WO 2004/027988 A1 | 4/2004 |

* cited by examiner

*Primary Examiner*—Patricia Nguyen
(74) *Attorney, Agent, or Firm*—McDermott Will & Emery LLP

(57) ABSTRACT

The invention relates to a feedback or feedforward type variable gain wideband amplifier. The variable gain wideband amplifier includes a feedback-type inversion amplifier circuit 310 for amplifying input Vin, a feedback-type non-inversion amplifier circuit 320 for amplifying input Vin, a power source circuit 330 for controlling the gain of the non-inversion amplifier circuit 320 and a load circuit 340 connected between a junction of output terminals of the inversion and non-inversion amplifier circuits 310 and 320 and power voltage potential VDD to control the gain of the amplifier circuits 310 and 320. The variable gain wideband amplifier of the invention is feedforward type, and outputs signals from the inversion and non-inversion amplifier circuits 310 and 320 via a single output terminal in order to attenuate third order intermodulation frequency IM3 generated from the amplifier circuits 310 and 320. Then, predetermined frequencies f1 and f2 included in the input signal are amplified.

12 Claims, 5 Drawing Sheets

VARIABLE GAIN WIDEBAND AMPLIFIER

RELATED APPLICATION

The present application is based on and claims priority from Korean Application Number 2005-17434, filed Mar. 2, 2005, the disclosure of which is hereby incorporated by reference herein in its entirety.

BACKGROUND OF THE INVENTION

1. Field of the Invention

The present invention relates to a variable gain wideband amplifier to be used as a low noise amplifier in a wideband system. More particularly, the invention relates to a feedback or feedforward type variable gain wideband amplifier.

2. Description of the Related Art

Currently, communication systems are required to operate at least two different frequency channels owing to increasing multiband implementation. When applied to a communication system using different frequency channels, an amplifier has to amplify different frequency channels in wideband. In addition, since all existing amplifiers have nonlinear characteristics, it is required to provide means for reducing third order Inter-Modulation Distortion (IMD3) originating from the interference of different frequency channels.

One of conventional feedback variable gain amplifiers is shown in FIGS. 1 and 2.

FIG. 1 is a circuit diagram illustrating a conventional variable gain amplifier, which includes an amplifier circuit AMP1 for amplifying an input signal and a gain controller GC1 feedback-connected to the amplifier circuit AMP1 to conduct gain control.

The amplifier circuit AMP1 includes an inductor L11, which is connected between power supply potential VDD and ground, and a first field effect transistor FET11. The first field effect transistor FET11 has a gate connected to input Vin and a drain connected to output Vout.

The gain controller GC1 is connected between input Vin and output Vout, and includes a second field effect transistor FET12, a capacitor C11, an inductor L12 and a resistor R11. The resistor R11 is connected in parallel between a drain and a source of the second field effect transistor FET12. Besides, the gate of the second field effect transistor FET 12 is connected to control voltage VC1. Detailed description on a variable gain amplifier as shown in FIG. 1 is presented in U.S. Pat. No. 6,285,257.

Reference will now be given to the operation of the conventional variable gain amplifier, in which the amplifier circuit AMP1 of the variable gain amplifier shown in FIG. 1 will not be described since it is well known in the art.

In the gain controller GC1, the resistor R11 maintains uniform voltage level between the drain and the source of the second field effect transistor FET12, and the capacitor C11 isolates voltage at the gate of the first field effect transistor FET11 from power supply potential VDD. Furthermore, by regulating voltage applied to the gate by control voltage VC1, the second field effect transistor FET12 functions as a variable resistor together with the resistor R11. The inductor L12, by enabling the gain controller GC1 to have positive impedance phase, functions to widen the phase range of a feedback signal.

FIG. 2 is an equivalent circuit diagram of the gain controller of the variable gain amplifier shown in FIG. 1, in which the second field effect transistor FET12 and the resistor R11 of the gain controller GC1 are connected in series.

As shown in FIG. 2, the equivalent circuit of the gain controller GC1 is equivalently expressed with the serial connection of a variable resistor R21, a capacitor C21 and an inductor L21.

The conventional variable gain amplifier as shown in FIG. 1 can adjust the resistance of the variable resistor R12 by a control voltage VC1 in order to control amplifier's gain. That is, the gain amplifier boosts up control voltage VC1 to have high gain in response to a small amount of input signal, but reduces control voltage VC1 to have low gain in response to a large amount of input signal.

However, the conventional variable gain amplifier has a field effect transistor as an active device existing on a feedback path for the purpose of gain control. Since the active device has its own resistance, there is a problem in that the FET transistor on the feedback path worsens noise characteristics.

Furthermore, where the conventional variable gain amplifier is applied to a wideband system using two different frequency channels, third order intermodulation frequency originating from intermodulation distortion of the different frequencies takes place in proximity of the channel. Then, such third order intermodulation distortion creates a problem of bad linearity, and the prior art does not teach any means for attenuating third order intermodulation distortion.

SUMMARY OF THE INVENTION

The present invention has been made to solve the foregoing problems of the prior art and it is therefore an object of the present invention to provide a variable gain wideband amplifier capable to varying gain in a wide range by controlling load.

It is another object of the invention to provide a variable gain wideband amplifier capable of improving linearity by conducting feedforward on an input signal.

According to an aspect of the invention for realizing the object, there is provided a variable gain wideband amplifier comprising: an inversion amplifier circuit for amplifying an input signal; a non-inversion amplifier circuit for amplifying the input signal; a power source circuit for controlling the gain of the non-inversion amplifier circuit; and a load circuit for controlling the gain of each of the inversion and non-inversion amplifier circuits, the load circuit connected between a junction of output terminals of the amplifier circuits and a power supply potential, whereby output signals from the inversion and non-inversion amplifier circuits are outputted via a common output signal terminal in order to attenuate third order intermodulation frequency generated by the amplifier circuits, thereby amplifying a predetermined frequency included in the input signal.

Preferably, the inversion amplifier circuit may comprise a main field effect transistor having a gate connected to an input signal terminal, a drain connected to the output signal terminal and a grounded source; and a feedback circuit having a plurality of passive devices connected in series between the gate and the drain of the main FET.

Preferably, the non-inversion amplifier circuit may comprise a first field effect transistor having a gate connected to first control voltage and a drain connected to the drain of the main field effect transistor and a source connected to the input signal terminal via a coupling capacitor, in which the first control voltage may have a preset magnitude of constant voltage.

Preferably, the power source circuit may comprise a second field effect transistor having a gate connected to a second control voltage, a drain connected to the source of the first field effect transistor of the non-inversion amplifier circuit and a grounded source.

Preferably, the load circuit may comprise a resistor connected between the power supply potential and the output signal terminal, use an inductor in place of the resistor in order to expand frequency, or use both of the resistor and inductor at the same time.

In this case, the load circuit may further comprise a third field effect transistor having a drain connected to the output signal terminal, a source connected to the drain of the main field effect transistor of the inversion amplifier circuit and a gate connected to third control voltage, in which the third control voltage may have a preset magnitude of constant voltage.

Preferably, the load circuit may further comprise a fourth field effect transistor a drain connected to one end of the load circuit, a source connected to the other end of the load circuit and having a gate connected to the fourth control voltage.

Furthermore, the load circuit may further comprise a fifth field effect transistor having a drain connected to the supply voltage terminal, a source connected to the source of the third field effect transistor and a gate connected to fifth control voltage.

In the above-described arrangements, the main FET, the first to third FETs and the fifth field effect transistor may of N channel conductivity type, and the fourth field effect transistor may be of P channel conductivity type.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

A preferred embodiment of the present invention will now be described in detail with reference to the accompanying drawings, in which the same reference signs are used to designate the same or reference components throughout.

Figure 1:
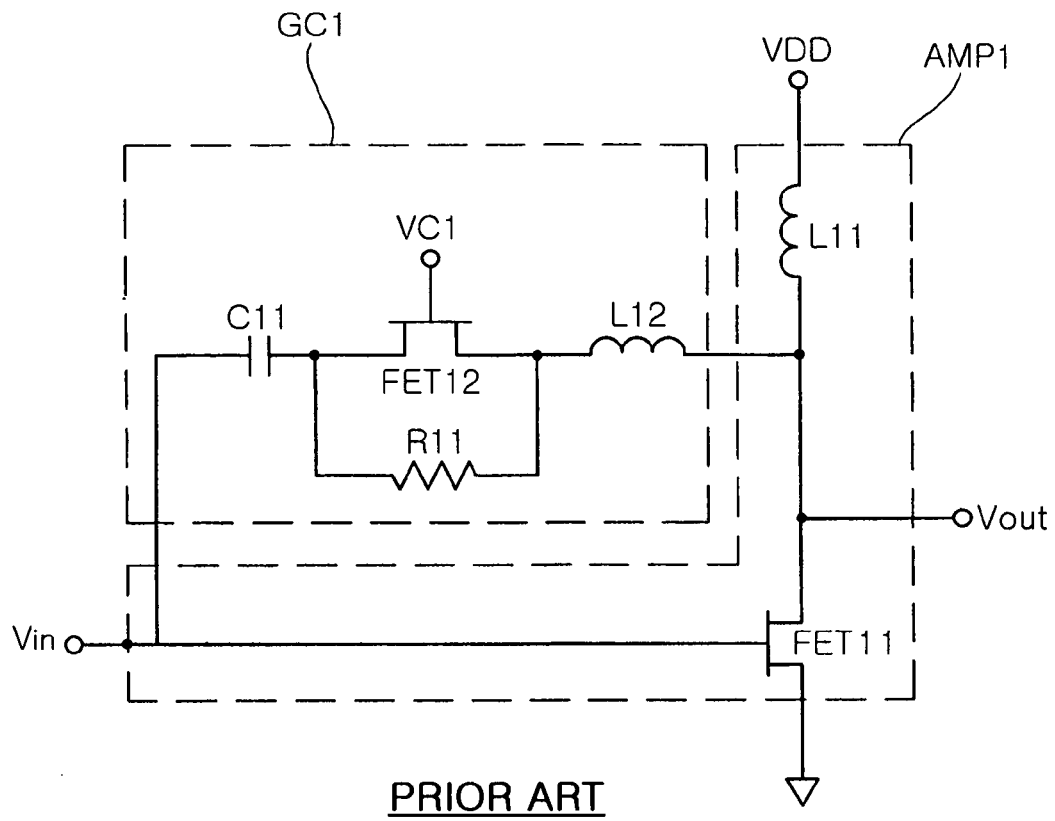
FIG. 1 is a circuit diagram illustrating a conventional variable gain amplifier.
Figure 2:
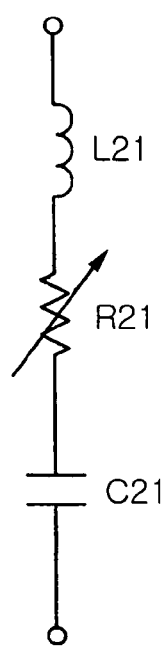
FIG. 2 is a circuit diagram illustrating a gain controller of the variable gain amplifier shown in FIG. 1.
Figure 3:
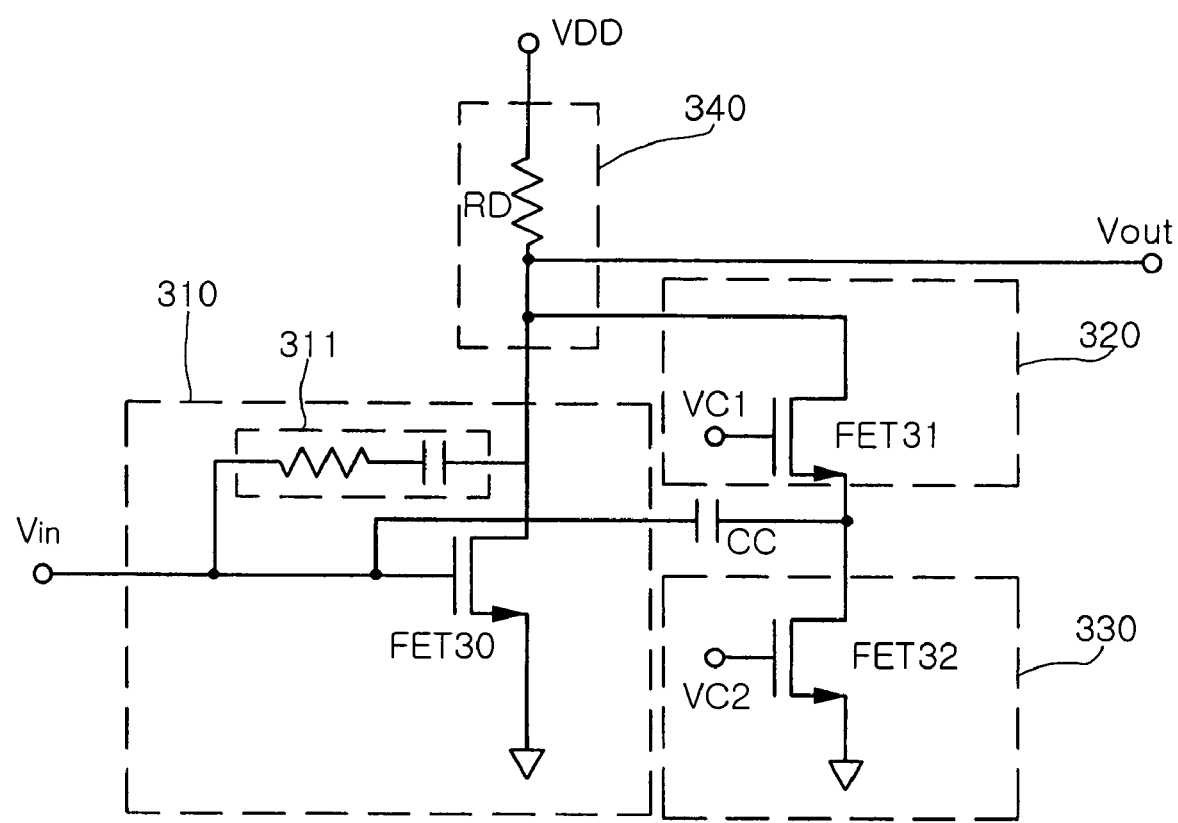
FIG. 3 is a circuit diagram illustrating a variable gain wideband amplifier of the invention.

FIG. 3 is a circuit diagram illustrating a variable gain wideband amplifier of the invention. Referring to FIG. 3, the variable gain wideband amplifier includes a feedback-type inversion amplifier circuit 310 for amplifying input Vin, a feedback-type non-inversion amplifier circuit 320 for amplifying input Vin, a power source circuit 330 for controlling the gain of the non-inversion amplifier circuit 320 and a load circuit 340 connected between a junction of output terminals of the inversion and non-inversion amplifier circuits 310 and 320 and power voltage potential VDD to control the gain of the amplifier circuits 310 and 320.

The variable gain wideband amplifier of the invention is feedforward type, which can output signals from the inversion and non-inversion amplifier circuits 310 and 320 via a single output terminal in order to attenuate third order intermodulation frequency IM3 generated from the amplifier circuits 310 and 320, thereby amplifying predetermined frequencies f1 and f2 included in the input signal.

The inversion amplifier circuit 310 includes a main field effect transistor FET30 having a gate connected to input Vin, a drain connected to output Vout and a grounded source; and a feedback circuit 311 having a plurality of passive devices connected in series between the gate and drain of the main field effect transistor FET30. Herein the main field effect transistor FET30 may be of N channel conductivity type.

The non-inversion amplifier circuit 320 includes a first field effect transistor FET31 having a gate connected to first control voltage VC1, a drain connected to the drain of the first field effect transistor FET 30 and a source connected to input Vin via a coupling capacitor CC. First control voltage VC1 may have a constant value, and the first field effect transistor FET31 may be of N channel conductivity type.

The gain control power source circuit 330 includes a second field effect transistor FET32 having a gate connected to second control voltage VC2, a drain connected to the source of the first field effect transistor FET 31 of the non-inversion amplifier circuit 320 and a grounded source. The second field effect transistor FET33 may be of N channel conductivity type.

Figure 4:
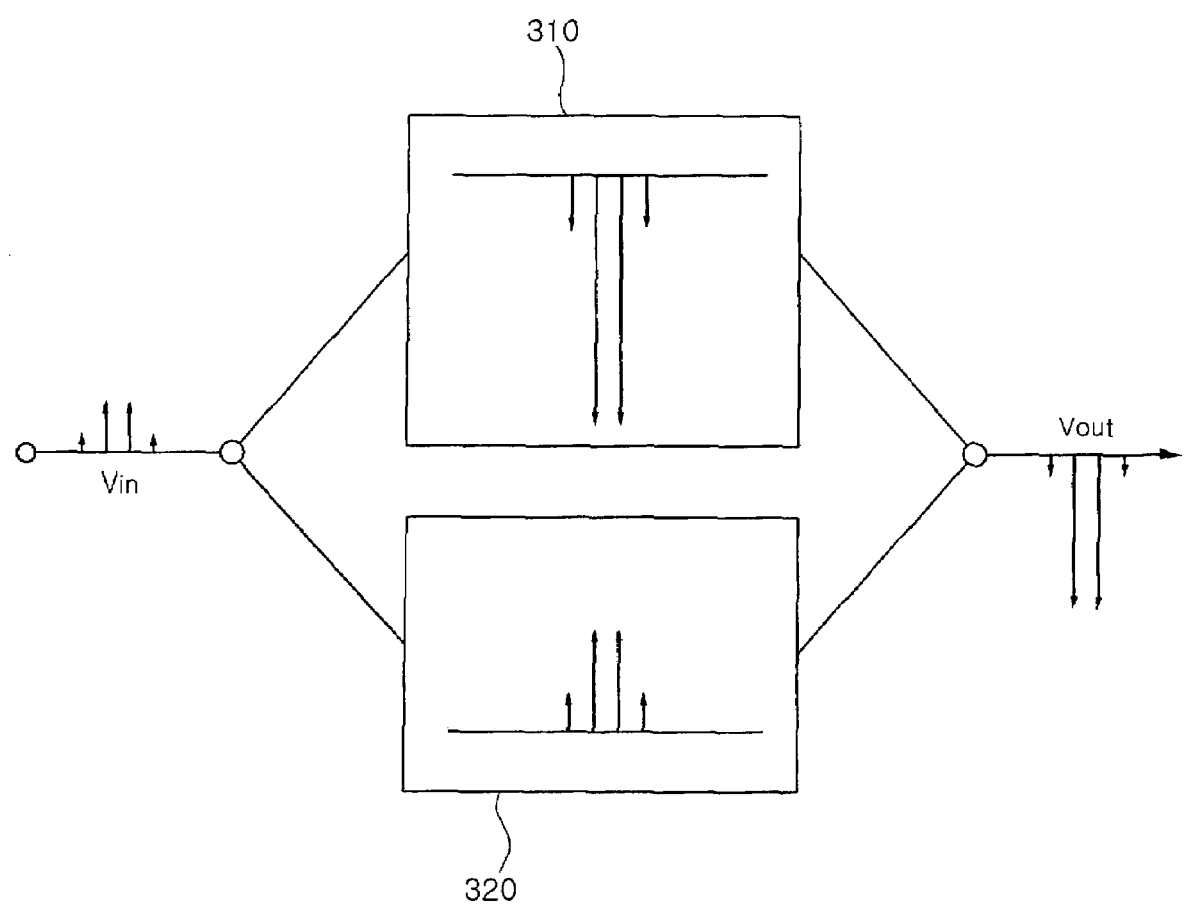
FIG. 4 is a diagram illustrating the operation of the variable gain wideband amplifier shown in FIG. 3.

FIG. 4 is a diagram illustrating the operation of the variable gain wideband amplifier shown in FIG. 3. Referring to FIG. 4, the variable gain wideband amplifier of the invention is applied to a wideband system using two different-frequency channels, in which the reference signs f1 and f2 designate desired, two different frequencies, and the reference sign IM3 designates third order intermodulation frequency generated from intermodulation distortion between the different frequencies f1 and f2.

The load circuit 340 includes a resistor RD connected between power supply potential VDD and output Vout. Alternatively, the load circuit 340 may also adopt an inductor instead of the resistor in order to expand frequency. Of course, both of the resistor and the inductor may be used together.

Figure 5:
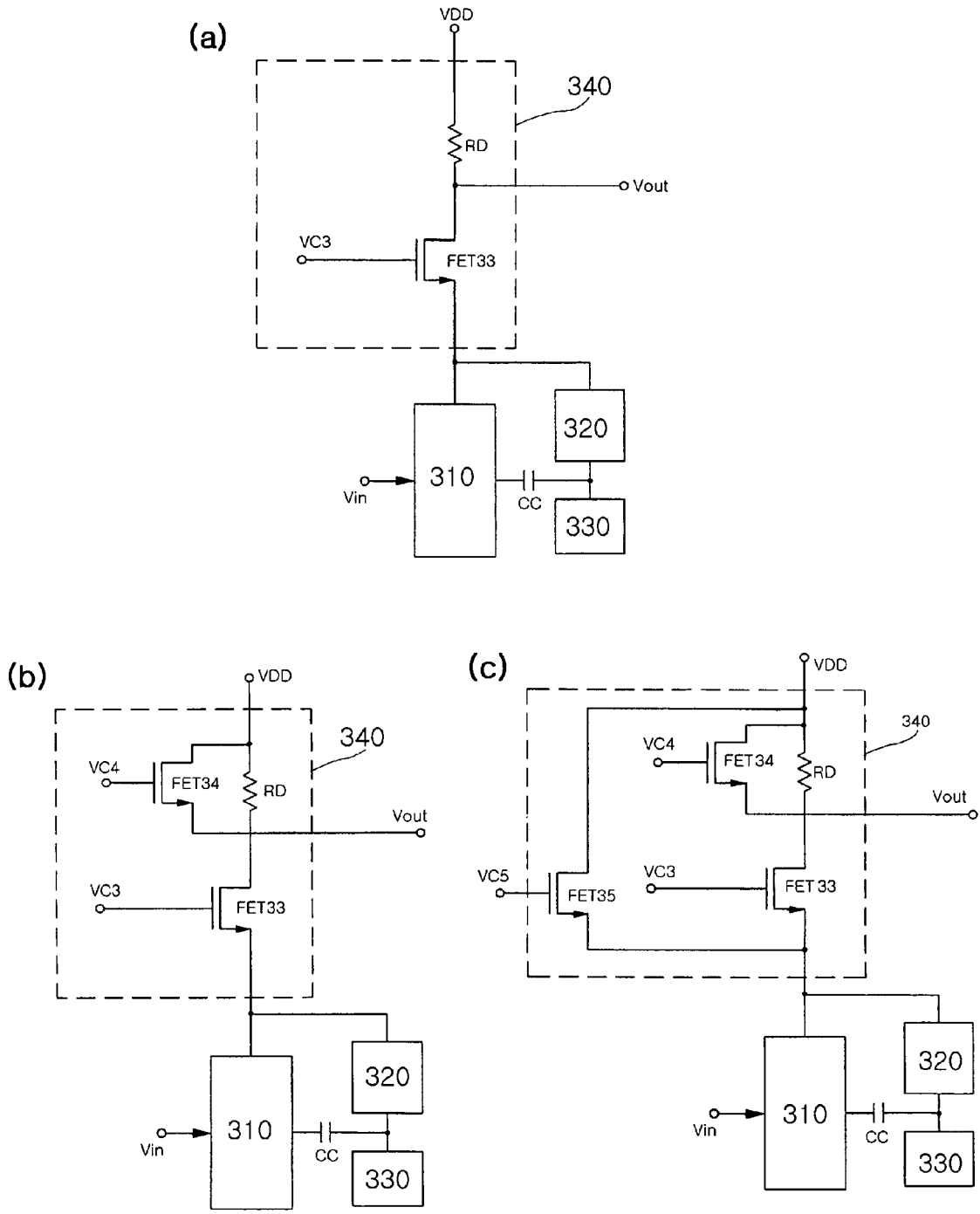
FIG. 5 is a circuit diagram illustrating internal circuits of a load circuit shown in FIG. 3.

The load circuit 340 shown in FIG. 3 may be constituted in various forms as shown in FIG. 5, which shows various examples of internal circuits of the load circuit 340.

As shown in FIG. 5(a), the load circuit 340 includes a third field effect transistor FET33 having a resistor RD connected between power supply potential VDD and output Vout, a drain connected to output Vout, a source connected to the drain of the main field effect transistor FET30 of the inversion amplifier circuit 310 and a gate connected to third control voltage VC3.

As shown in FIG. 5(b), the load circuit 340 includes a third field effect transistor FET33 having a resistor RD connected between power supply potential VDD and output Vout, a drain connected to output Vout, a source connected to the drain of the main field effect transistor FET 30 of the inversion amplifier 310 and a gate connected to third control voltage VC3; and a fourth field effect transistor FET34 having a drain connected to one end of the resistor RD, a source connected to the other end of the resistor RD and a gate connected to fourth control voltage VC4.

Furthermore, as shown in FIG. 5(c), the load circuit 340 includes a third field effect transistor FET33 having a resistor RD connected between power supply potential VDD and output Vout, a drain connected to output Vout, a source connected to the drain of the main field effect transistor FET30 of the inversion amplifier 310, a gate connected to third control voltage VC3; a fourth field effect transistor FET34 having a drain connected to one end of the resistor RD, a source connected to the other end of the resistor RD and a gate connected to fourth control voltage VC4; and a fifth field effect transistor FET35 having a drain connected to power supply potential VDD, a source connected to the source of the third field effect transistor FET33 and a gate connected to fifth control voltage VC5.

In FIG. 5, third control voltage VC3 may have a preset constant value, both of the third and fifth field effect transistors FET33 and FET35 may be of N channel conductivity type, and the fourth field effect transistors FET34 may be of P channel conductivity type.

Figure 6:
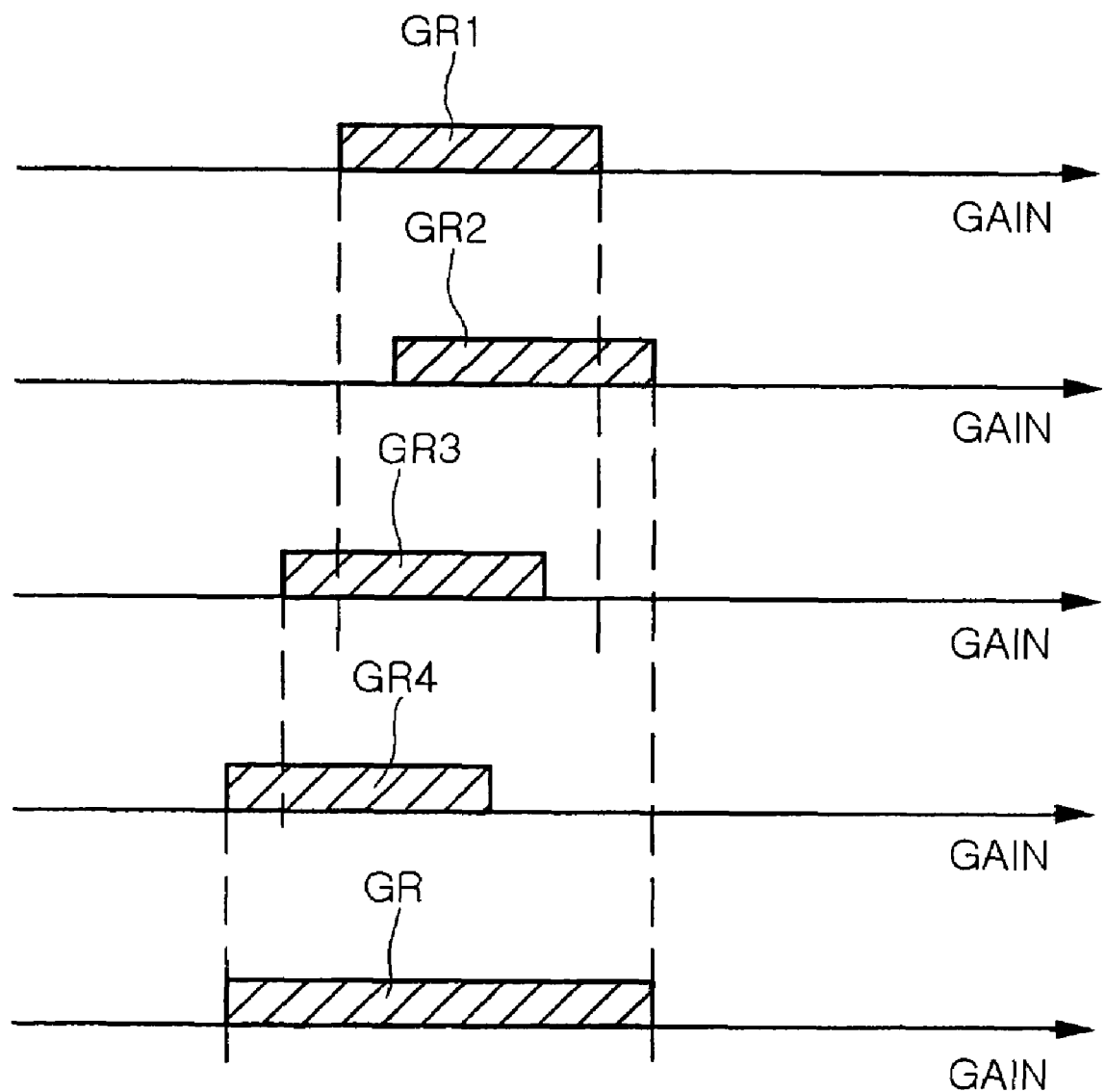
FIG. 6 is a diagram illustrating gain variable range of the variable gain wideband amplifier of the invention.

FIG. 6 is a diagram illustrating gain variable range of the variable gain wideband amplifier of the invention. Referring to FIG. 6, the reference signs GR1 to GR4 are used to designate gain variable ranges of the variable gain wideband amplifier of the invention according to variable loads of the load circuit 340.

Now reference will be given in detail to the operation and effects of the invention with reference to the accompanying drawings.

When the variable gain wideband amplifier is applied to a wideband system processing two different, desired frequencies f1 and f2, an input signal of the variable gain wideband amplifier contains the desired frequencies f1 and f2, which generate third order intermodulation frequency IM3 while passing through the variable gain wideband amplifier. Then, the variable gain wideband amplifier of the invention amplifies the desired frequencies but attenuate the third order intermodulation frequency IM3, which will be described in detail hereafter with reference to FIGS. 3 to 6.

First, the inversion amplifier circuit 310 of the variable gain wideband amplifier conducts inversion-amplification to input Vin. Where the inversion amplifier circuit 310 includes the main field effect transistor FET30, signal-input is conducted via the gate of the main field effect transistor FET30, signal-output is conducted via the drain of the main field effect transistor FET30. Thus, with the main field effect transistor FET30, the inversion amplifier circuit 310 conduct 180° phase inversion to the desired frequencies f1 and f2 contained in an input signal and the third order intermodulation frequency IM3 originating from harmonic wave interference of the desired frequencies f1 and f2.

In addition, the feedback circuit 311 of the inversion amplifier circuit 310 includes a plurality of passive devices connected in series between the gate of the main field effect transistor FET30 and the drain. The passive devices may correspond to a combination of a resistor, capacitor and inductor. With this feedback circuit 311, the variable gain wideband amplifier of the invention can carry out wideband impedance matching thereby achieving uniform gain in high frequency ranges.

Next the non-inversion amplifier circuit 320 of the invention conducts non-inversion amplification to the input signal, and the gain control power source circuit 330 of the invention controls the gain of the non-inversion amplifier circuit 130.

Where the non-inversion amplifier circuit 320 includes the first field effect transistor FET31, an input signal is inputted via the source of the first field effect transistor FET31, and an output signal is outputted via the drain of the first field effect transistor FET31. With the first field effect transistor FET31, the non-inversion amplifier 320 amplifies without inversion the desired frequencies f1 and f2 contained in the input signal and the third order intermodulation frequency IM3 originating from harmonic wave interference of the desired frequencies f1 and f2.

In this case, first voltage applied from first voltage VC1 to the gate of the first field effect transistor FET31 may be fixed for example to 1.1V.

As shown in FIG. 4, the variable gain wideband amplifier of the invention can output signals from the inversion and non-inversion amplifier circuits 310 and 320 via a single output signal terminal, and thus amplify desired frequencies f1 and f2 in an input signal to a preset value while attenuating a third order intermodulation frequency IM3 to a very small value, thereby improving linearity.

Reference will now be given to an operation of controlling the gain of the non-inversion amplifier 320 by the gain control power source circuit 330.

Where the gain control power source circuit 330 includes the second field effect transistor FET32, the second field effect transistor FET32 may be switched on or off by setting second control voltage applied to the gate of the second field effect transistor as high or low voltage.

If the second field effect transistor FET32 is switched off, an input signal is amplified only by the inversion amplifier circuit 310. If the second field effect transistor FET32 is switched on, the input signal is amplified by the inversion and non-inversion amplifier circuits 310 and 320.

If the second control voltage is raised with the second field effect transistor FET32 switched on, voltage flowing through drain- and source-side ends of the second field effect transistor FET32. This also increases voltage flowing through drain- and source-side ends of the first field effect transistor FET31, thereby raising signal amplification gain by the first field effect transistor FET31.

On the contrary, any decrease in second control voltage causes reduction also in voltages flowing through the drain- and source-side ends of the first and second field effect transistors, thereby dropping signal amplification gain by the first field effect transistor FET31.

As described above, the invention can adjust the magnitude of the desired frequencies f1 and f2 in the output signal and the third order intermodulation frequency IM3 by regulating the gain of the non-inversion amplifier circuit 320 using the gain control power source circuit 330. So, the third order intermodulation frequency IM3 can be substantially removed when adjusted by the non-inversion amplifier circuit 320.

Where the main field effect transistor FET30 and the first field effect transistor FET31 are used with different property, the inversion and non-inversion amplifier circuits 310 and 320 can output desired frequencies with a preset magnitude and attenuate a third order intermodulation frequency by a remarkable degree.

Describing this operation in more detail, output by the inversion amplifier circuit 310 can be expressed with input frequencies (first order) and an intermodulation frequency (third order) according to Equation 1 below, and output by the non-inversion amplifier 320 can be expressed with input frequencies (first order) and an intermodulation frequency (third order) according to Equation 2 below:

$$y1 = -(A_x x + A_\alpha x^3) \qquad \text{Equation 1,}$$

and $$y2 = -(B_x x + B_\beta x^3) \qquad \text{Equation 2,}$$

wherein y1 is output by the inversion amplifier circuit 310, x is input, A is gain, α is constant determined by the magnitude of the main field effect transistor FET30, sign '−' indicates phase inversion, y2 is output by the non-inversion amplifier circuit 320, and β is constant determined by the magnitude of the first field effect transistor FET31.

Furthermore, since output by the inversion amplifier circuit 310 and output by the non-inversion amplifier circuit 320 are combined in the variable gain wideband amplifier of the invention, output Vout by the variable gain wideband amplifier can be expressed according to Equation 3 below:

$$Vout = y2 - y1 = (B-A)_x + (B_\beta - A_\alpha)x^3 \quad \text{Equation 3.}$$

In Equation 3 above, A is gain by the inversion amplifier 310, which is determined by the voltage of the main field effect transistor FET30 and the resistance of the load circuit 340, and α is determined by the length and width of the main field effect transistor FET30. Also, B is gain by the non-inversion amplifier circuit 320, which is determined by the voltage of the first field effect transistor FET31 and the resistance of the load circuit 340, and β is determined by the length and width of the first field effect transistor FET31.

When A and B are determined by the current and resistance, the size of the first field effect transistor FET31 of the non-inversion amplifier circuit 320 is adjusted to delete the third order component so that a factor 'Bβ−Aα' of the third order term becomes 0. This as a result can improve the linearity of the variable gain wideband amplifier of the invention.

The load circuit 340 has its own load that influences the gain of the variable gain wideband amplifier including the inversion and non-inversion amplifier circuits 310 and 320. So, the gain of the variable gain wideband amplifier of the invention can be controlled by varying the load of the load circuit 340, as will be described hereafter.

Referring to FIG. 5, the gain of the variable gain wideband amplifier of the invention including the inversion amplifier 310 and the non-inversion amplifier 320 is determined by the total resistance RT and FET characteristics provided by the load circuit 340. In this case, FET characteristics include FET trans-conductance and FET magnitude. The resistor RD of the load circuit 340 gives influence on the amplifier circuits 310 and 320, which can be explained by Equation 4 below:

$$A \propto gm \times RT \quad \text{Equation 4,}$$

wherein A is gain, and gm is trans-conductance.

As seen in Equation 4 above, enhancing the total resistance RT by the load circuit 340 increases also the gain of the variable gain wideband amplifier of the invention.

Where the load circuit 340 includes the resistor RD as shown in FIG. 3, the total resistance RT of the load circuit 340 corresponds to the resistance of the resistor RD, which makes the gain of the inversion amplifier circuit 310 fixed without variation. On the other hand, the gain of the non-inversion amplifier circuit 320 is varied according to second control voltage VC2. As a result, the variable gain wideband amplifier of the invention has a predetermined range of variable gain designated with GR1 as shown in FIG. 6.

In FIG. 5(a), the third filed effect transistor FET33 is added in series to the resistor RD of the load circuit 340. If third control voltage VC3 has a predetermined value (e.g., 1.8V), the third field effect transistor FET33 has its own resistance so that the total resistance RT of the load circuit 340 exceeds the resistance of the resistor RD. Then, the variable gain wideband amplifier of the invention has a predetermined range of variable gain as designated with GR2 in FIG. 6. This shows that GT2 can be varied to a higher gain level than GR1.

In FIG. 5(b), the fourth field effect transistor FET34 is further added in parallel to the resistor RD of the load circuit 340. If fourth control voltage VC4 applied to gate of the fourth field effect transistor FET34 has a predetermined value (e.g., 0 to 1.8V), the fourth field effect transistor FET34 has a resistance corresponding to the magnitude of fourth control voltage VC4 so that the total resistance RT of the load circuit 340 becomes smaller than the total resistance of FIG. 5(b). Then, the variable gain wideband amplifier of the invention has a predetermined range of variable gain as designated with GR3 in FIG. 6. This shows that GR3 can be varied to a lower gain level than GR2.

Furthermore, in FIG. 5(c), the fifth field effect transistor FET35 is added in parallel to the load circuit 340 shown in FIG. 5(b). If fifth control voltage VC5 applied to the gate of the fifth field effect transistor FET35 has a predetermined value (e.g., 0 to 1.8V), the fifth field effect transistor FET35 has a resistance according to the magnitude of fifth control voltage VC5 so that the total resistance RT of the load circuit 340 becomes smaller than the total resistance of FIG. 5(c). Then, the variable gain wideband amplifier of the invention has a predetermined gain as designated with GR4 in FIG. 6. This shows that GR4 can be varied to a lower gain level than GR3.

As described above with reference to FIG. 5, it is possible to control the operation the third to fifth field effect transistors FET33-35 by third to fifth control voltage VC3-5, thereby adjusting the variable gain range of the non-inversion amplifier 310 from GR1 to GR4. Thus, the load circuit 340 of the invention affords the variable gain wideband amplifier with a wide range of variable gain GR as shown in FIG. 6.

According to the invention as described above, gain can be varied in a wide range by controlling load. Furthermore, through inversion and non-inversion amplification to an input signal and output carried out by a single output terminal, it is possible to amplify a desired frequency to a preset magnitude while attenuating third order intermodulation frequency remarkably, thereby improving linearity.

While the present invention has been shown and described in connection with the preferred embodiments, it will be apparent to those skilled in the art that modifications and variations can be made without departing from the spirit and scope of the invention as defined by the appended claims.

What is claimed is:

1. A variable gain wideband amplifier comprising:
   an inversion amplifier circuit for amplifying an input signal;
   a non-inversion amplifier circuit for amplifying the input signal;
   a power source circuit for controlling the gain of the non-inversion amplifier circuit; and
   a load circuit for controlling the gain of each of the inversion and non-inversion amplifier circuits, the load circuit connected between a junction of output terminals of the amplifier circuits and a power supply potential,
   whereby output signals from the inversion and non-inversion amplifier circuits are outputted via a common output signal terminal in order to attenuate third order intermodulation frequency generated by the amplifier circuits, thereby amplifying a predetermined frequency included in the input signal.

2. The variable gain wideband amplifier according to claim 1, wherein the inversion amplifier circuit comprises:

a main field effect transistor having a gate connected to an input signal terminal, a drain connected to the output signal terminal and a grounded source; and a feedback circuit having a plurality of passive devices connected in series between the gate and the drain of the main FET.

3. The variable gain wideband amplifier according to claim 2, wherein the non-inversion amplifier circuit comprises a first field effect transistor having a gate connected to first control voltage and a drain connected to the drain of the main field effect transistor and a source connected to the input signal terminal via a coupling capacitor.

4. The variable gain wideband amplifier according to claim 3, wherein the first control voltage has a preset magnitude of constant voltage.

5. The variable gain wideband amplifier according to claim 3, wherein the power source circuit comprises a second field effect transistor having a gate connected to a second control voltage, a drain connected to the source of the first field effect transistor of the non-inversion amplifier circuit and a grounded source.

6. The variable gain wideband amplifier according to claim 5, wherein the load circuit comprises a resistor connected between the power supply potential and the output signal terminal.

7. The variable gain wideband amplifier according to claim 6, wherein the load circuit further comprises a third field effect transistor having a drain connected to the output signal terminal, a source connected to the drain of the main field effect transistor of the inversion amplifier circuit and a gate connected to third control voltage.

8. The variable gain wideband amplifier according to claim 7, wherein the third control voltage has a preset magnitude of constant voltage.

9. The variable gain wideband amplifier according to claim 7, wherein the load circuit further comprises a fourth field effect transistor a drain connected to one end of the load circuit, a source connected to the other end of the load circuit and having a gate connected to the fourth control voltage.

10. The variable gain wideband amplifier according to claim 9, wherein the load circuit further comprises a fifth field effect transistor having a drain connected to the supply voltage terminal, a source connected to the source of the third field effect transistor and a gate connected to fifth control voltage.

11. The variable gain wideband amplifier according to claim 10, wherein the main FET, the first to third FETs and the fifth field effect transistor are of N channel conductivity type.

12. The variable gain wideband amplifier according to claim 10, wherein the fourth field effect transistor is of P channel conductivity type.

* * * * *